United States Patent
Flannery

(10) Patent No.: US 7,061,062 B2
(45) Date of Patent: Jun. 13, 2006

(54) INTEGRATED CIRCUIT WITH UNIFIED INPUT DEVICE, MICROPROCESSOR AND DISPLAY SYSTEMS

(75) Inventor: Michael R. Flannery, Sioux City, IA (US)

(73) Assignee: Gateway Inc., Irvine, CA (US)

( * ) Notice: Subject to any disclaimer, the term of this patent is extended or adjusted under 35 U.S.C. 154(b) by 0 days.

(21) Appl. No.: 09/346,283

(22) Filed: Jul. 1, 1999

(65) Prior Publication Data

US 2002/0113284 A1    Aug. 22, 2002

(51) Int. Cl.
*H01L 27/14* (2006.01)

(52) U.S. Cl. .............. 257/415; 257/414; 257/417; 257/421; 257/428; 257/431

(58) Field of Classification Search ............ 257/414, 257/425, 419, 443, 444, 470, 461, 430, 417, 257/467, 415; 345/84–85, 98, 104, 108, 345/204–207; 361/681, 686, 717–718
See application file for complete search history.

(56) References Cited

U.S. PATENT DOCUMENTS

| | | | | |
|---|---|---|---|---|
| 3,757,511 A | * | 9/1973 | Burgess et al. | 368/83 |
| 5,113,041 A | | 5/1992 | Blonder et al. | 178/18 |
| 5,280,265 A | | 1/1994 | Kramer et al. | 338/210 |
| 5,324,980 A | * | 6/1994 | Kusunoki | 257/74 |
| 5,339,090 A | | 8/1994 | Crossland et al. | 345/90 |
| 5,362,952 A | | 11/1994 | Nair et al. | 235/449 |
| 5,412,372 A | * | 5/1995 | Parkhurst et al. | 340/568 |
| 5,471,405 A | | 11/1995 | Marsh | 364/556 |
| 5,501,990 A | * | 3/1996 | Holm et al. | 438/34 |
| 5,526,700 A | | 6/1996 | Akeel | 73/862.043 |
| 5,541,372 A | | 7/1996 | Baller et al. | 178/20 |
| 5,543,988 A | * | 8/1996 | Brady et al. | 360/112 |
| 5,557,739 A | * | 9/1996 | Gupta et al. | 714/34 |
| 5,566,010 A | * | 10/1996 | Ishii et al. | 349/42 |
| 5,610,667 A | | 3/1997 | Hush et al. | 348/796 |
| 5,812,191 A | * | 9/1998 | Orava et al. | 348/308 |
| 5,990,473 A | * | 11/1999 | Dickey et al. | 250/231.13 |
| 6,014,120 A | * | 1/2000 | Chiu et al. | 345/82 |
| 6,014,240 A | * | 1/2000 | Floyd et al. | 359/201 |
| 6,087,701 A | * | 7/2000 | Bergstrom et al. | 257/414 |
| 6,122,042 A | * | 9/2000 | Wunderman et al. | 356/73 |
| 6,133,954 A | * | 10/2000 | Jie et al. | 348/308 |

(Continued)

FOREIGN PATENT DOCUMENTS

JP    08068991 A  *  3/1996

Primary Examiner—Jerome Jackson
Assistant Examiner—José R. Díaz
(74) Attorney, Agent, or Firm—Scott Richardson; Olds, Maier & Richardson PLLC

(57) ABSTRACT

An integrated circuit having at least one micromechanical element thereon is described comprising a support substrate, a sensor element electrically connected to a logic circuit, and the logic circuit electrically connected to a semiconductor visual display element. The integrated circuit may be manufactured by a process which comprises providing a support substrate, forming at least two elements selected from a first group consisting of a micromechanical sensor element, a logic circuit and a semiconductor visual display element on said support, and manufacturing at third element on said support substrate, said third element selected from a second group consisting of a micromechanical sensor element, logic circuit and a semiconductor display element, which was not selected from the first group. In one embodiment of the process of manufacture, all three of at least three elements are constructed on the support itself, preferably by a microlithographic process.

21 Claims, 1 Drawing Sheet

U.S. PATENT DOCUMENTS

| | | | |
|---|---|---|---|
| 6,137,165 A * | 10/2000 | Thierry | 257/690 |
| 6,222,208 B1 * | 4/2001 | Ogihara et al. | 257/101 |
| 6,274,861 B1 * | 8/2001 | Zhang et al. | 250/208.1 |
| 6,307,815 B1 * | 10/2001 | Polosky et al. | 368/220 |
| 2002/0003169 A1 * | 1/2002 | Cooper | 235/492 |
| 2002/0125410 A1 * | 9/2002 | Zhang et al. | 250/208.1 |

* cited by examiner

INTEGRATED CIRCUIT WITH UNIFIED INPUT DEVICE, MICROPROCESSOR AND DISPLAY SYSTEMS

BACKGROUND OF THE INVENTION

1. Field of the Invention

The present invention relates to micromachine integrated circuits, and more particularly to micromachine integrated circuits which contain at least three functions selected from an input device, microprocessor and a display device supported on a single support. The support may be a single, continuous, semiconductor substrate.

2. Background of the Art

Integrated circuits are a fundamental building block in many different forms of electronic devices. Individual circuit elements on the chips which may be combined into the integrated circuit are interconnected by thin conductive or semiconductive elements (e.g., layers or films), and the individual circuits are insulated from the remainder of the circuit by thin dielectric layers. Chips are assembled into packages containing external electrical leads to facilitate insertion into printed circuit boards for interconnection with other circuits or components.

The functional components of the integrated circuits, the microchips, chips and other components which are integrated into the circuitry have steadily increased in strength, speed, and versatility, while at the same time decreasing in size. These changes provide a regularly changing environment within which to design circuitry with functionality which was only capable of theory a few years ago.

Integrated circuits are used in a wide area of commercial and consumer technology, including, for example, calculators, computers, video games, digital watches, appliances (such as radios, televisions, magnetic recording devices, etc.), automobiles, diagnostic equipment (in industrial, pollution control, household and medical settings), traffic control devices, communication devices, and the like. The basic method of construction for many of these devices is to provide the necessary functions (e.g., data reception, data analysis, display, electrical control, etc.) as distinct and separately constructed units which are combined within a single product. The need to have, for example, three separate functions in the same device can necessitate three separate places or companies producing each of the individual elements, with a single location combining the three separate and individual elements into a single device. This type of operation creates an opportunity for higher probability of damage to the final article by shipping of the individual pieces from location to location and by the necessity of manipulation of the individual devices into a single composite. This type of construction also should require separate quality control analysis and testing of the individual components as well as the final product. These factors tend to add to the cost and likelihood of failure in an integrated circuit.

Although it is necessary in many types of electronic devices to have the functions of data reception, data analysis (by a microprocessor) and display provided in a single device, it has been necessary to provide at least one of the individual functions (usually the display) separately and then electrically integrate the separate display component into a final device. For example, in a facsimile machine, there is one component for receiving data, a second component for converting the data to signals which can be electrostatically (or other imaging format) printed, and a visual display to indicate the type of operations which the machine is performing. At least the visual display component is separately manufactured and the various components then electrically connected within the designed format for the machine.

U.S. Pat. No. 5,541,372 discloses a force activated touch screen which measures the deformation of the front panel. There is a built-in strain sensor and microprocessor.

U.S. Pat. No. 5,471,405 discloses an apparatus for measurement of forces which are applied to a garment. A display panel is attached to the microprocessor unit for display of measurements.

U.S. Pat. No. 5,339,090 discloses spatial light modulators. One modification provides a smart crystal comprising a crystal display on a semiconductor substrate.

It is now possible to construct integrated circuits with moving parts built into the board containing the integrated circuit. This ability is usually referred to as microengineering. The constructed moving parts may be physical switches, gears, levers, moving contacts, retractable or extendable elements, thermally expandable or thermally contractable warning elements, shutters, moving filter elements, and the like. Even solid state laser elements may be considered a moving part within certain uses within the technology by practitioners. The sensitivity of these elements, their fragility, and their susceptability to damage by being in an environment where further mechanical or chemical working may occur has made manufacture of elements with these microengineered or micromachined components tedious and expensive. Micromachine circuits or microengineered circuits are devices that have such moving parts within the panel or board structure of the circuit. The moving parts are usually constructed by forming segments of the moving parts from separate resist layers, one at a time, with the result moving part having been built into place.

SUMMARY OF THE INVENTION

An integrated circuit with at least one movable microengineered part is described comprising a support substrate, a movable microengineered part (which may comprise the later identified sensor), a sensor element electrically connected to a logic circuit, and the logic circuit electrically connected to a semiconductor visual display element.

The integrated circuit may be manufactured by a process which comprises:

a) providing a support substrate,
b) forming at least two elements selected from the group consisting of a sensor device or element, a logic circuit and a semiconductor visual display element on said support, and
c) providing a third element selected from the group consisting of a sensor device or element, a logic circuit and a semiconductor visual display element which was not provided in step b).

Before, during or after these steps in the process, the microengineered element may be manufactured into the circuit.

In one embodiment, all three of the at least three elements are constructed on the support itself. At least one of the three elements, and preferably the first manufactured element, may be formed (as by deposition, etching, pre-exposure of a dry-film resist layer and transfer to the circuit support layer, etc.) on a temporary support element with adhesive, direct thermal lamination or other means of adherency transfer to the final permanent support along with the at least two other elements.

DETAILED DESCRIPTION OF THE INVENTION

Figure 1:
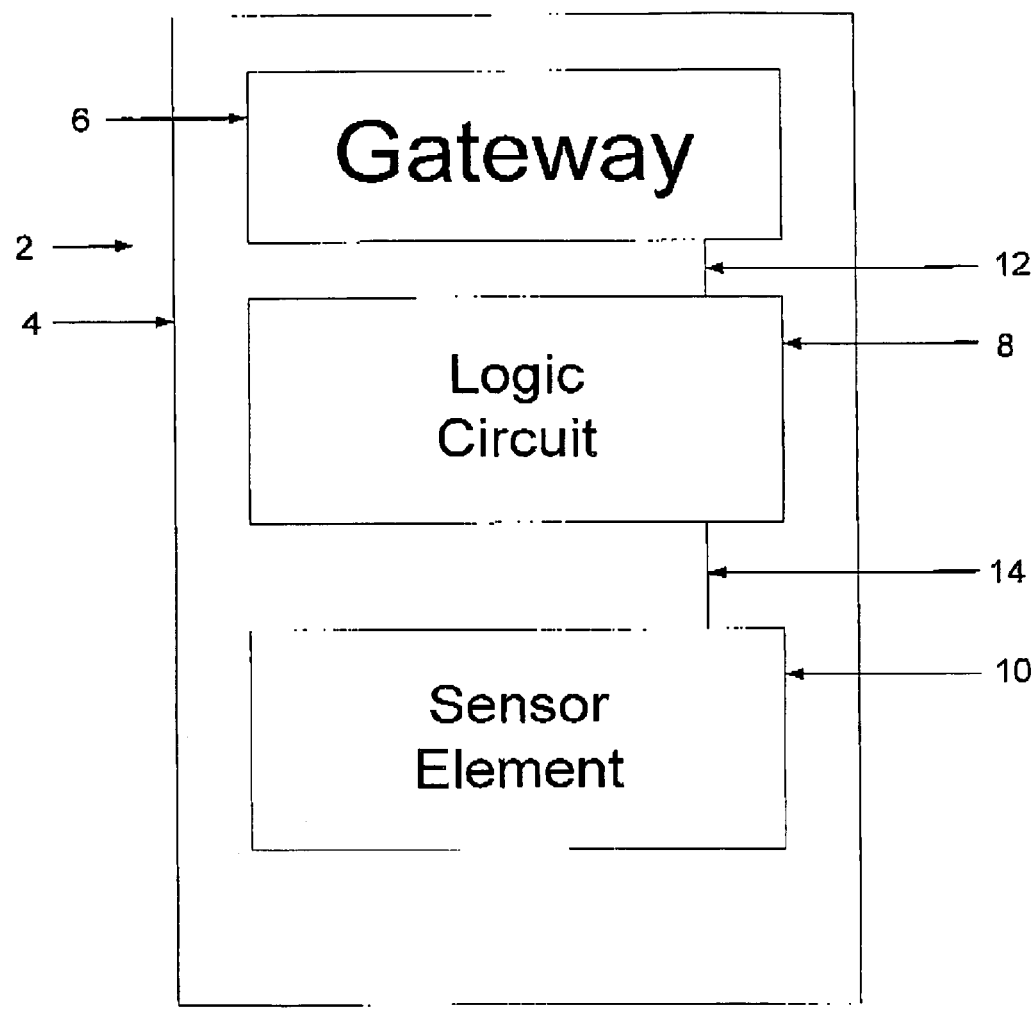
FIG. 1 shows an integrated circuit according to the present invention having at least three functions comprising an input device, a microprocessor and a display device on a support.

The present invention comprises an integrated circuit having at least three functions provided on a single substrate, the at least three functions comprising an input device, a microprocessor and a display device, at least one of the elements providing the function comprising a microengineered movable element. At least these three functions are incorporated onto a single substrate as opposed to the three distinct functions being preformed on independent and separate substrates which are then electrically connected.

The input device or input element may be any function which produces or receives information which may then be processed for further use. For example, the input device may be a strain gauge, pressure gauge or pressure sensor, temperature gauge, accelerometer, inertial sensor, pH gauge, sound gauge, gas sensor, RF wave sensor, electrical sensor, and the like. These input elements may comprise the microengineered element or micromechanical element defined above. It is preferred that the sensor element perform as a strain gauge, thermal gauge, radiation gauge (including visible light), or chemically responsive gauge (e.g., identifying the presence of classes of chemicals to which the sensor is exposed, as by changes in surface conductivity of the element in the presence of effective chemical species).

The sensor must be able to generate an electrical signal in response to some condition or change in the environment in which it is located. There are a variety of ways in which the input device (or input element, the terms being used interchangeably) may be incorporated into the substrate of the present invention. The input elements can be parts that are separately manufactured in distinct microengineering steps on the substrate, or they can be constructed on the backing support of the substrate itself in conjunction with the formation of other elements by conventional photolithographic or other manufacturing processes consistent with or conventional with manufacture of circuitry, especially mirocircuitry. The formation of each individual element on the substrate by imaging of the same photosensitive layer at different regions on the support would be preferred according to the present invention. It is of course possible for the other two elements (microprocessor and display device) being constructed on the substrate itself by different process steps with different photosensitive layers or other manufacturing systems, and an improvement in efficiency is still obtained with the input device being separately constructed on the same support, at least because of the potential for reduced waste by avoiding physical joining of separate layers. The input elements, such as sensing gauges, can be created on the substrate by ordered deposition of materials onto or into the surface of the substrate. For example, microlithographic techniques, printing techniques, etching and deposition techniques, beam implantation, vapor and/or chemical deposition, electroless deposition, mask deposition and screening, and the other many forms by which gauges have been previously made may be used in the construction of this input device. More than one input device may be present on the integrated circuit or substrate as long as the microprocessor is capable of operating with each of the input devices, separately or simultaneously. Micromachining of the input device may also be accomplished on the substrate itself.

Similarly the logic or microprocessor is formed in the semiconductor substrate, using well known processing techniques. The microprocessor component is to be designed to perform specific functions upon the data or signal sent from the data input device. For example, if the input device is a strain gauge, the microprocessor will evaluate the signals to determine the amount of movement or flexing which the strain gauge has undergone. If the input device responds to temperature changes, the microprocessor will identify the temperature, the change in temperature or the rate in change of temperature according to its built in function. The microprocessor, upon performing a function upon the data or signal from the input device then transmits a signal to the display device to provide an image on the display device which is in response to the transmitted signal. Usually the signal will contain information sufficient to cause an alphanumeric image to be generated on the display device.

Standard integrated digital-logic circuits may be present on the substrate, and the logic gates may be constructed by any of the many available semiconductor technologies. They may be simple gate-level logic or larger scale integrated circuits. Both the simple logic circuits (AND, OR, NOT, NAND and NOR) may be used, or more complex flip-flop circuits. Again, it is preferred that the logic be constructed on the substrate. If the display device and the input device are machined or constructed on the substrate, there is still benefit in reducing the number of components which are separately constructed and then added to the substrate (as would be the case if the input device and display were constructed on the substrate and the logic were constructed separately and attached to the substrate).

The display systems useful in the practice of the present invention are those systems which can be constructed or transferred onto the support or substrate for the integrated circuit, as opposed to a display system which must be separately constructed on a permanent, distinct support and then electrically connected with the other device elements, as would be the case with a liquid crystal display element. Examples of useful display formats for use in the present invention include photoemitting semiconductor arrays and especially arrays of gallium-arsenide light-emitting pn junctions, such as those demonstrated by Motorola, Inc. at its Communications Products Laboratory in Tempe, Ariz. This array can provide pixels with dimensions of less than 20 micrometers, preferably less than 15 micrometers, and more preferably 10 micrometers or less, with a pitch that is 1.5 to 3.0 times the size of the pixels, preferably about twice the size of the pixels (e.g., a pitch of about 20 micrometers for a 10 micrometer pixel). The GaAs device and its drivers may be flip-chip bonded face down onto a transparent substrate (e.g., glass). A specially designed plastic diffractive, refractive optical element can be used which turns the light emitted from the array through a 90° angle and can magnify the image (with a 15× magnification reported). As with other semiconductor display elements, the array may be deposited by chemical means then etched, may be vapor deposited through a screen, may be printed onto the substrate, or produced by any of the many available techniques which are known for the imagewise provision of fine resolution materials. Semiconductor electrodes may be vapor deposited, coated, sputtered, sputter etched, chemically or focussed beam etched (in place or transferred from a support surface to the board) or the like, and may be composed of any of the many available electroluminescent semiconductors such as CDs, CdSe, rare earth oxysulfides and rare earth oxybromides, zinc oxide, zinc sulfide, and even organic electroluminescent materials such as the poly-N-vinylcarbazoles, and bisbenzocarbazolophenylmethane. Any material which is capable of being deposited in fine resolution (e.g., pixels less than 25 micrometers, preferably less than 20 micrometers, and more preferably less than 15 or less than 10 micrometers) and which is electroluminescent (emits visible radiation upon electrical stimulation without rapid decomposition) can be used in the practice of the present invention. The light-emitting pn junctions, such as those comprising GaAs, are preferred. In all of these semiconductor or pn junction pixel arrays, dopants, charge carriers or light-emission enhancers may of be used within the semiconductors or junctions, as the case may be.

The individual pixels may be arranged to provide a monochrome image or may comprise different compositions for ordered sets of pixels so that a multicolor (e.g., two color, three color or four color or more) emission can be provided by the arrays. The display device is connected to the logic circuit or power supply in a conventional manner so that, upon direction from the microprocessor, signals are sent to the appropriate pixels to provide the desired image output.

FIG. 1 shows a typical construction of an integrated circuit 2 within the scope of the present invention. The integrated circuit 2 comprises a support element 4 comprising any semiconductor based structure having an exposed surface with which an integrated circuit structure of the present invention may be formed. The term "substrate" may include one or more layers that have been fabricated into a sheet or support, and may include other functional layers fabricated thereon. For example, but without limitation of this concept, doped and undoped semiconductors, epitaxial semiconductor layers supported by a base semiconductor or insulator, as well as other semiconductor structures may be used. On the support element or substrate 4 are a visual display element 6 a logic circuit 8 and a sensor device 10. In this case, the sensor device 10 may be a strain gauge. The visual display element 6 may be a GaAs pn junction connected by conductor 12 to the logic element 8 which is in turn connected by conductor 14 to the sensor device 10. Upon application of pressure or strain to strain gauge 10, a signal is conveyed to the logic element 8. This signal is considered by the logic circuit 8 and a signal or series of signals (as determined by the programming of the logic circuit 8) is sent to the visual display device to generate a visual image (usually in alphanumerics) in the display device. Each of the individual functions (the sensor element 10, the logic circuit 8, and the visual display element 6) were formed on the support or substrate 4 directly or formed on a temporary support element and transferred to the support substrate 4).

After formation of the integrated circuit, the final commercial article may be completed by encasing the integrated circuit with all of the elements thereon in a protective casing. The casing should of course be designed so that the display element is exposed for viewing. The other elements may or may not be so exposed, as is desired or required to perform any desired function. Casings made of high impact polyolefins (polyethylene and/or polypropylene) are most common, but casings of any other polymeric material (e.g., polyester, polyamide, polyacrylate) may be used, as may casings of composite or metallic materials.

What is claimed:

1. An integrated circuit with a micromechanical element comprising:
   a semiconductor substrate;
   a micromechanical sensor element formed on the semiconductor substrate and comprising a microengineered movable element;
   a logic circuit formed on the semiconductor substrate; and
   a semiconductor visual display element formed on the semiconductor substrate;
   wherein the sensor element is electrically connected to the logic circuit, and the logic circuit is electrically connected to the semiconductor visual display element.

2. The integrated circuit of claim 1 wherein said semiconductor display element comprises an array of light-emitting pn junctions.

3. The integrated circuit of claim 2 wherein said light-emitting pn junctions comprise GaAs light-emitting pn junctions.

4. The integrated circuit of claim 3 wherein said visual display element comprises an array of semiconductor pixels having pitch dimensions of less than 20 micrometers.

5. The integrated circuit of claim 2 wherein said visual display element comprises an array of semiconductor pixels having pitch dimensions of less than 20 micrometers.

6. The integrated circuit of claim 1 wherein said visual display element comprises an array of semiconductor pixels having pitch dimensions of less than 20 micrometers.

7. The integrated circuit of claim 1 wherein said sensor element is selected from the group consisting of strain gauges, thermal gauges, radiation gauges, and chemically responsive gauges.

8. The integrated circuit of claim 1 wherein the visual display element provides a visual indication of a condition sensed by the sensor element.

9. The integrated circuit of claim 8 wherein the visual indication comprises an alphanumeric character.

10. The integrated circuit of claim 8 wherein the visual indication comprises multiple colors.

11. An integrated circuit with a micromechanical element comprising:
    a semiconductor substrate;
    a moveable micromechanical sensor element formed on the semiconductor substrate;
    a logic circuit formed on the semiconductor substrate; and
    a semiconductor light emitting visual display element formed on the semiconductor substrate;
    wherein the moveable micromechanical sensor element is electrically connected to the logic circuit, and the logic circuit is electrically connected to the semiconductor light emitting visual display element.

12. An integrated circuit provided on a semiconductor substrate with a unified input element and display element, the integrated circuit comprising:
    a moveable microengineered input element formed on the substrate;
    a logic circuit configured on the substrate and electrically connected to the input element; and
    an output element, the logic circuit being electrically connected to the output element;
    wherein the output element is a semiconductor visual display element formed on the substrate.

13. The integrated circuit of claim 12, wherein the input element is selected from a group consisting of an inertial sensor and an accelerometer.

14. The integrated circuit of claim 12, wherein the input element is selected from a group consisting of a strain gauge, a thermal gauge, a radiation gauge, and a chemically responsive gauge.

15. The integrated circuit of claim 12, wherein the input element is a micromechanical sensor element.

16. The integrated circuit of claim 15, wherein the micromechanical sensor element is configured to generate an electrical signal in response to an environmental or conditional change.

17. The integrated circuit of claim 16, wherein the output element is an array comprising pixels of less than 25 micrometers.

18. The integrated circuit of claim 16, wherein the output element is an array comprising pixels configured to display alphanumeric characters.

19. The integrated circuit of claim 18 wherein the input element is a first input element, the integrated circuit further comprising:
a second input element.

20. An integrated circuit provided on a semiconductor substrate with a unified input element and display element, the integrated circuit comprising:
a moveable microengineered input element formed on the substrate that senses a condition;
a logic circuit configured on the substrate and electrically connected to the input element; and
a visual display element supported by the substrate and coupled to the logic circuit that provides a visual image;
wherein the visual image is a visual representation of the sensed condition.

21. An integrated circuit provided on a semiconductor substrate with a unified input element and display element, the integrated circuit comprising:
a moveable microengineered input element formed on the substrate that senses a condition, wherein the input element is a strain gauge;
a logic circuit configured on the substrate and electrically connected to the input element; and
a visual display element having multiple light-emitting pn junctions supported by the substrate and coupled to the logic circuit, wherein the visual display element provides a visual image comprising a visual representation of the sensed condition.

* * * * *